United States Patent [19]

Schilling et al.

[11] 4,075,682
[45] Feb. 21, 1978

[54] GAS-INSULATED THYRISTOR ASSEMBLY

[75] Inventors: Kurt Schilling; Manfred Schraudolph; Gerd Thiele; Jürgen Weber, all of Erlangen, Germany

[73] Assignee: Siemens Aktiengesellschaft, Munich, Germany

[21] Appl. No.: 696,435

[22] Filed: June 15, 1976

[30] Foreign Application Priority Data

July 4, 1975 Germany .............................. 2530017

[51] Int. Cl.² ............................................. H05K 7/20
[52] U.S. Cl. ...................................... 361/386; 357/76; 363/141
[58] Field of Search ............. 321/8 C, 27 R; 361/331, 361/380, 381, 382, 385, 386, 388; 357/76; 307/252 L; 174/35 R; 313/237

[56] References Cited

U.S. PATENT DOCUMENTS

| 3,443,142 | 5/1969 | Koppel | 313/237 |
| 3,497,726 | 2/1970 | Rice | 307/252 L |
| 3,943,426 | 3/1976 | Thiele | 321/8 C |

FOREIGN PATENT DOCUMENTS

| 1,563,403 | 4/1970 | Germany. |
| 1,914,790 | 10/1970 | Germany. |
| 2,160,302 | 6/1973 | Germany. |

Primary Examiner—Gerald P. Tolin
Attorney, Agent, or Firm—Kenyon & Kenyon, Reilly, Carr & Chapin

[57] ABSTRACT

A gas-insulated thyristor assembly is disclosed. The assembly comprises at least one thyristor column which includes disk-type thyristors which are arranged in side by side relationship. The assembly further includes drive and circuit component modules associated with the thyristors. In accordance with the invention, a rotationally-symmetric metallic shield surrounds the disk-type thyristors and is supported within a cylindrical metallic pressure tube by insulating posts. The opposite ends of the aforesaid pressure tube are closed off by bulkheads comprised of insulating material and the tube is adapted to receive $SF_6$ gas under pressure. A detachable electrical connecting line is passed through each bulkhead and the pressure tube is adapted to be detachably connectable with adjoining pressure tubes.

17 Claims, 3 Drawing Figures

GAS-INSULATED THYRISTOR ASSEMBLY

BACKGROUND OF THE INVENTION

1. Field of the Invention

The invention relates to a gas-insulated thyristor assembly and, in particular, to a thyristor assembly comprised of at least one thyristor column in which disk-type thyristors are stacked side by side, held in place under spring pressure and separated by heat sinks which serve at least partially for the conduction of current.

2. Field of the Invention

A thyristor assembly of the above type which employs liquid cooling is disclosed in the German Offenlegungsschrift No. 1,914,790. Such thyristor assemblies are used as building blocks for modules in the construction of air or oil insulated valves for converters. In such case, groups of circuit components are associated with the thyristor assemblies for protecting them against overcurrents and overvoltages, and drive modules are also associated with the assemblies for transmitting control pulses to the disk-type thyristors. Converters of this type are used for rectifying high voltages, for example, in highvoltage d-c transmission systems (HGUe systems).

When HGUe installations are used in areas of high density, the size of the installation is required to be as small as possible in order to conserve space. Also, for operational reasons, the converters used therein must have completely encapsulated valves and grounded encapsulation. This precludes the use of valves with air insulation. Moreover, while oil-insulated valves in which the thyristor columns are placed in an oil-filled tank can be used, such use is also frequently precluded because of the combustible nature of the oil. The use oil-filled tanks is also disadvantageous in that the entire tank must be drained for repairs, thereby shutting down the entire installation for an extended period of time.

It is an object of the present invention to provide a thyristor assembly of the above type which is both safe and compact.

SUMMARY OF THE INVENTION

In accordance with the principles of the present invention, the above and other objectives are accomplished in a thyristor assembly of the above type by further including therein a rotationally-symmetric metallic shield which surrounds at least one thyristor of at least one thyristor column, as well as the drive and at least part of the circuit component group associated with that one thyristor. The shield is electrically connected to the thyristor and is supported by insulating posts within a metallic cylindrical pressure tube. Opposite ends of the tube are closed off by bulkheads comprised of insulating material and the tube is adapted to receive $SF_6$ gas under pressure. Electrical connecting elements are also passed through each bulkhead in a gas-tight manner.

The aforesaid thyristor assembly provides a modular building block from which converters of different design can be simply built. The thyristor assembly is completely encapsulated and the pressure tube can be grounded. As a result, danger of accidents is precluded, while the assembly is very compact in design especially since the cylindrical pressure tube geometry permits taking up the internal pressure resulting from the pressurized $SF_6$ gas. In addition, the diameter of the pressure tube can be adapted to the potential of the thyristor assembly, so that only a small gas volume is required. Because of the bulkheads at the ends of the tube, only the assembly and not the entire installation is required to be degassed if the assembly becomes defective.

Preferably the metallic shield surrounds all the thyristors of the column. Alternatively, a number of metallic shields can be provided each for surrounding a different disk-type thyristor of the thyristor column and the drive means and circuit component module associated with that thyristor. In this case, the metal shields are arranged in spaced side by side relationship. Also, in this case each metallic shield is caused to reside at the potential of its associated disk-type thyristor. As a result, the overall structure of the column can be reduced in size, at the expense of increasing its overall cost.

The metallic shield is preferably formed from two shells of substantially semicircular cross section. These shells can be opened in a simple manner, whereby the disk-type thyristors and the associated drive and circuit component groups are made readily accessible. In order to obtain a good field distribution in the pressure tube, the opposite ends of the shells are curved inward.

Preferably, arranged between each bulkhead and its associated end of the pressure tube is a tubular connecting member which is connected to the end of the pressure tube in a gastight and detachable manner. When using such connecting members, the removal of the pressure tube when connected to other structural members is greatly simplified. For example, in disassembly, the mechanical connection of the connecting member with the adjoining structural elements is preserved and only the mechanical connection between the pressure tube and the connecting member needs to be opened.

It is also advantageous to design at least one of the tubular connecting members as a nodal element and mechanical support point and, hence, to serve as an electrical connection with other structural elements and as a part of the support structure for the assembly. Each tubular connecting member can, additionally be provided with an opening which can be closed off in a gastight manner and via which the electrical coupling elements designed as plug connections can be disconnected.

BRIEF DESCRIPTION OF THE DRAWINGS

The above and other features and aspects of the present invention will become apparent upon reading the following detailed description in conjunction with the attached drawings, in which.

DETAILED DESCRIPTION

Figure 1:
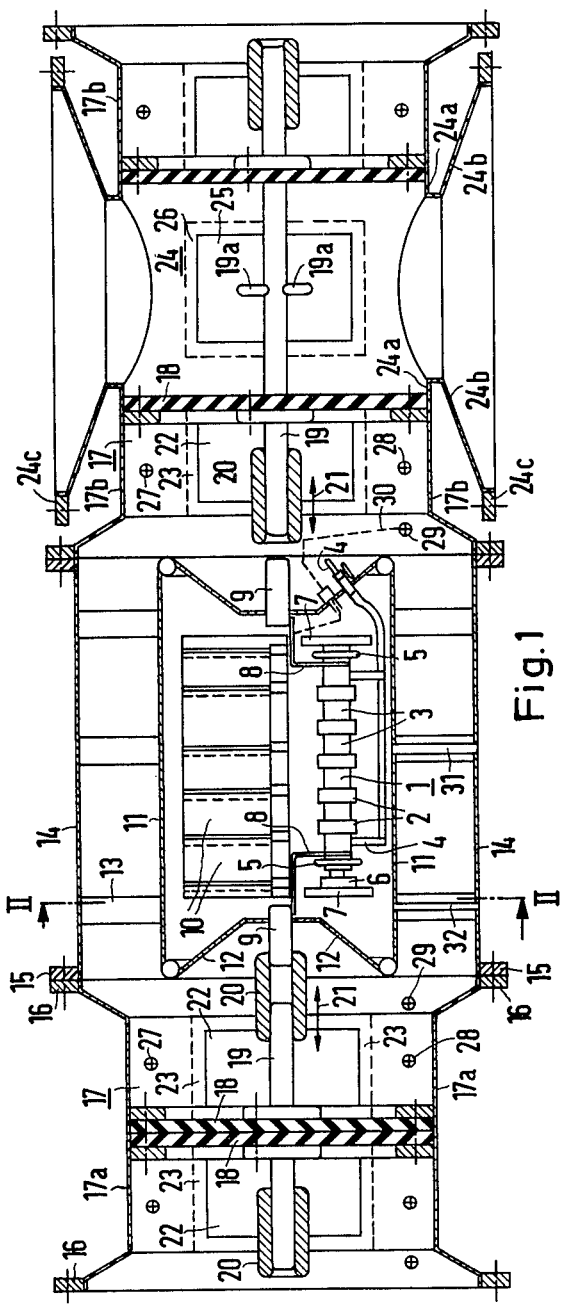
FIG. 1 shows an embodiment of a thyristor assembly in accordance with the principles of the present invention.

FIG. 1 shows a cross-section of a thyristor assembly in accordance with the principles of the present invention. The thyristor assembly comprises a thyristor column 1 which may be of the type described in detail in the above mentioned German Offenlegungsschrift No. 1,914,790. More particularly, the thyristor column 1 includes a number of disk-type thyristors 2 arranged in side by side relationship and between which are disposed heat sinks 3 which rest against the sides of the thyristors. As shown, the column 1 is liquid-cooled by the heat sinks 3 which are fed coolant from a coolant line 4. Heat sinks for use in providing such liquid-cooling are described, for example, in the German Offenlegungsschrift No. 2,160,302. Alternatively, gas-cooled heat sinks employing $SF_6$ gas as the cooling medium may also be employed.

The disk-type thyristors and the heat sinks 3 are clamped in a frame 7 via insulators 5 and a pressure member 6. The configuration of the pressure member 6 and the frame 7 may be similar to that described in the above-mentioned German Offenlegungsschrift No. 1,914,790.

The heat sinks 3 at the extreme ends of the thyristor column 1 are connected to electrical connecting elements 9 via lines 8. Thus, in the present illustrative embodiment, all the heat sinks 3 serve to conduct electrical current and all the disk-type thyristors 2 are connected in series. Associated with the disk-type thyristors 2 are drive means and circuit component groups 10 which are shown as being arranged above the thyristor column 1. To avoid overcomplicating the drawing, the electrical connecting lines between the disk-type thyristors 2 and the drive and circuit components groups 10 have not been specifically illustrated in FIG. 1.

The thyristor column 1 and the drive means and circuit component groups 10 are surrounded by a rotationally symmetric metallic shield 11, which in the present case is illustrated as being cylindrical. The shield 11 can also be formed from a plastic shell which is provided on its inner and/or outer surface with a metallic coating. The metallic shield 11 will be discussed in further detail in connection with FIG. 2.

Fastened at both ends of the metallic shield 11 via support plates 12 comprised of insulating material, e.g., cast resin, are electrical connecting elements 9. Also supported by and passing through the right most support plate 12 is the coolant line 4. The metallic shield 11 is held at a potential which corresponds approximately to the mean potential of the thyristor column 1 via an electrical connecting line which is also not specifically shown in FIG. 1.

As an alternative to employing a single metallic shield to surround the column 1, a separate metallic shield may be provided for each disk-type thyristor 2 and its associated drive and circuit component group 10. In such case, the shields would be arranged in spaced side by side relationship, and each shield would be held at the potential of its associated disk-type thyristor. As a result, the diameter of the metallic shields employed and, thus, the overall size of the thyristor assembly would be reduced. However, such reduction in size would be accompanied by an increased cost, owing to the need of substantially more components than when only one shield is employed.

A number of insulated posts 13 which may, for example, be cast resin posts, are employed to support or fasten the shield 11 within a metallic pressure tube 14 which may be comprised of steel, aluminum or copper. The tube 14 may, likewise, be formed from a shell whose inner and/or outer surfaces are provided with a metallic coating. The plastic material used for such a shell might be glass-fiber reinforced, unsaturated polyester resin. The pressure tube 14 is adapted to receive $SF_6$ gas and is grounded. Also, being of cylindrical configuration, it is able to take up the 2 to 3 bar of internal pressure resulting from the $SF_6$ gas being brought into the thyristor assembly, while still having a relatively small wall thickness.

The pressure tube 14 is bolted at both ends, via ring flanges 15, to the ring flanges 16 of a tubular connecting member 17, a gastight joint being ensured by seals between the ring flanges 15 and 16. In the present illustrative embodiment, two different configurations for the connecting members 17 are shown. The connecting member 17a at the left end of the pressure tube 14 merely serves as a bulkhead for the pressure tube 14 and for the mechanical and electrical connection with an adjoining pressure tube. The connecting piece 17b at the right end of the pressure tube is designed, in addition, as a nodal element and mechanical support point, as will be explained in further detail hereinafter.

The tubular connecting piece 17a is closed off by a bulkhead 18. The latter is in the form of a plane plate of electrically insulating material, e.g., cast resin, and is disposed substantially perpendicularly and rotationally symmetric to the central axis. An electrical connecting conductor 19 passes in a gastight fashion through the plate 18.

The connecting member 17a is connected to a similar connecting member of an adjacent thyristor assembly. As illustrated, the members 17 are integral members. Alternatively, each connecting member may be a separate element and the elements bolted to each other via ring flanges.

The electrical connection between the two connecting elements 9 and 19 is realized with a sleeve 20, which can be moved by hand in the direction of the arrow 21. Thus, the sleeve 20 provides an easily detachable plug connection between the electrical connecting elements 9 and 19. This plug connection is accessible via an opening 22 which is arranged in the wall of the connecting member 17a and can be closed in a gas-tight manner with a cover 23. As can be appreciated, if a thyristor assembly is to be replaced because of defective operation, for example, its removal only requires movement of the sleeves 20 via the openings 22 and loosening of the screw connections between the ring flanges 15 and 16. This permits the pressure cylinder 14 and its enclosed components to be removed and an operative cylinder to be installed in a few minutes. A converter constructed with such thyristor assemblies is, therefore, easy to service.

The connecting member 17b shown on the right-hand side of the pressure cylinder 14 includes a portion identical to the connecting member 17a. In addition, it also includes a member 24 which serves as a nodal element and mechanical support point. More particularly the member 24 comprises a tubular extension 24a which, in the present illustrative example, is shown as merging into the connecting piece 17b of the next adjacent thyristor assembly. The extension 24a is provided with two funnel-shaped connecting members 24b, which are adapted to be bolted via ring flanges 24c to additional components equipped with pressure tubes. Alternatively, a separate bulkhead may be provided at the end of each connecting piece 24b, whereby the element 24 can be closed off in a gastight manner.

The electrical connecting conductor 19 passes through the tubular extension 24a and into the bulkhead 18 of a connecting member 17b of an adjacent assembly. The portion of the connecting conductor 19 which is within the tubular extension 24a is equipped with connecting elements 19a. These elements are accessible via an assembly opening 25 in the wall of the extension 24a and can be connected to the conductor of another element via a plug connection. The opening 25 can likewise be closed off in a gas-tight manner by a cover 26.

The funnel-shaped connecting members 24b may be bolted to the pressure tubes of modular elements in which further electrical components, e.g., sectional valve chokes or compensating capacitors, are arranged or they may be bolted to tubes which provide mechanical support to the assembly.

It should be further mentioned that each of the tubular connecting members 17a and 17b has gas inlet or outlet openings 27, an opening 28 for supplying or discharging coolant, and an opening 29 through which a light guide 30 extends for providing control pulses to the drive modules 10. The mechanical configuration of openings 27, 28 and 29 and the connection between the openings 28 and the coolant line 4 have not been specifically illustrated in FIG. 1, so as not to overcomplicate the drawing. For the same reason, the light guide 30 is only indicated schematically.

It should be noted that the coolant line and the light guide can be constructed differently than as illustrated by line 4 and guide 30. More particularly, as also shown in FIG. 1, the coolant lines and light guide may be coupled through the cast resin posts 13 and wall of tube 14. This is illustrated by the coolant line 31 and the light guide 32. Additionally, such elements can be helically arranged in their respective posts to strengthen the insulation path. If cast resin posts are used, the light guides 32 may also be optically accessible via a window in the wall of pressure cylinder 14.

Figure 2:
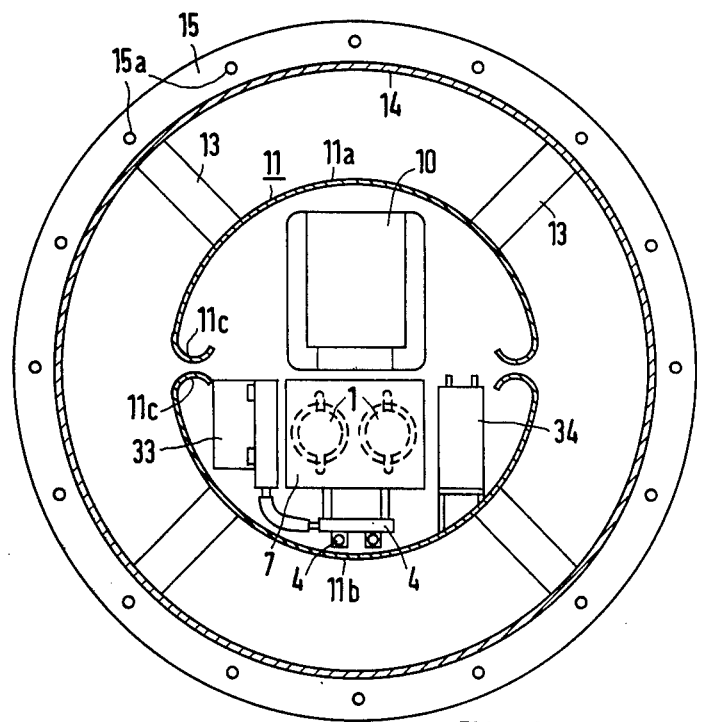
FIG. 2 shows a cross section through the thyristor of FIG. 1 taken along the lines II—II.

FIG. 2 shows a cross section of the thyristor assembly of FIG. 1 taken along the line II—II of FIG. 1. As shown, the metallic shield 11 is comprised of two shells 11a and 11b which are of substantially semicircular cross section. The adjacent ends 11c of the two shells 11a and 11b are curved inward, so that a good field distribution is obtained in the pressure tube 14. With this configuration for the shields, the thyristor column 1 and the drive and circuit components groups 10 situated therein are readily accessible. More particularly, if the metallic shield 11 is removed from the pressure tube 14, the shell 11a need only be taken off to expose the modules 10 and the column 1.

As also can be seen in FIG. 2, the thyristor assembly is actually illustrated as comprising two thyristor columns 1 arranged in side by side relationship in the shell 11b. Also located in this shell are the circuit resistors 33 and the circuit capacitors 34, the latter being cooled with coolant from the coolant line 4. The shell 11a on the other hand, houses the electronics of the drive and circuit component groups 10. The thyristor columns 1, as well as the circuit resistors 33 and capacitors 34 and the modules 10, are fastened to their respective shells 11a and 11b via posts which have not been shown to preserve the clarity of the drawing. FIG. 2 also shows screw holes in the ring flange 15 which serve for receiving screws for bolting the flange to the flanges of the tubular members 17.

Figure 3:
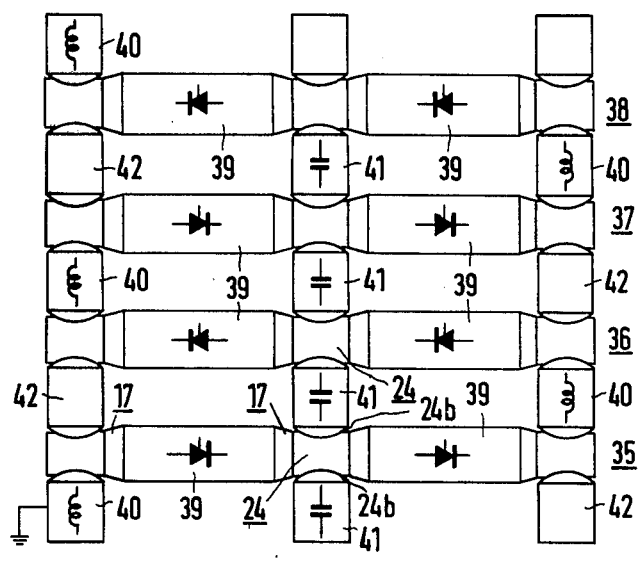
FIG. 3 shows a converter valve formed from a number of thyristor assemblies similar to the assembly of FIG. 1.

FIG. 3 shows a converter valve in which groups of series-connected thyristors are arranged in valve assemblies or stories 35 to 38 situated one on top of the other. Such a converter can be used to form a branch of a converter and its valve construction is disclosed, for example, in the German Offenlegungsschrift No. 1,563,403.

In the FIG. 3, each valve assembly is constructed from two thyristor assemblies 39 which are similar to the thyristor assembly of FIG. 1. These thyristor assemblies are connected in series and arranged in meander-fashion. Moreover, the thyristor assemblies 39 are each provided at their ends with connecting members 17 having tubular elements 24 which serve as nodal elements. More particularly, the funnel-shaped extensions 24b of the elements 24 of each assembly are bolted to a similar extension of the assembly immediately below via one of the tubular support elements 40, 41, and 42. The elements 40 and 41 are designed as pressure tubes, equipped with electrical components and adapted to be filled with $SF_6$ gas. The support elements 42, on the other hand, merely serve as a mechanical connections and supports and permit the realization of a self-supporting valve structure. Alternatively, the valve can be mechanically supported by a separate frame, which is not shown in the figure.

The use of support elements 40 and 41, which include electrical components, greatly simplifies the design of the converter valve. The support elements 40 contain, as indicated symbolically, sectional valve chokes which are required for the RLC circuitry associated with the valve. The support elements 41, on the other hand, include compensating capacitors, also symbolically illustrated, which are required for controlling the valve potential. Since the elements 40 and 41 are also completely encapsulated, a completely encapsulated $SF_6$-gas-filled converter valve is realized which has grounded pressure tubes, meets all safety requirements and occupies very little space.

It should be further mentioned that all components of the converter of FIG. 3 which contain electrical components, due to the design of the components, are very easy to replace. Moreover, to accomplish replacement of a defective component only the component needs to be degassed. The remainder of the valve therefore remains intact, so that it can be put back into operation after a relatively short delay. In addition, the converter can be inexpensively produced due to the modular nature of the components.

What is claimed is:
1. A gas insulated thyristor assembly comprising:
   at least one thyristor column comprised of disc-type thyristors stacked in side by side relationship and of heat sinks each arranged between adjacent pairs of thyristors and serving to conduct current;
   drive means and circuit component groups connected to said one thyristor column;
   substantially rotationally symmetric metallic shielding means, said shielding means being disposed in surrounding relationship to said one thyristor column and to the drive means and at least a part of the circuit component groups connected to that one thyristor column;
   a pressure tube surrounding said metallic shielding means and adapted to receive $SF_6$ gas under pressure;
   first means for supporting said shielding means within said tube including insulating posts;
   first and second bulkhead means for closing off the opposite ends of said pressure tube;
   and first and second electrical connecting means extending in a gastight manner through said first and second bulkhead means, respectively, and providing electrical connections to said column.

2. A thyristor assembly in accordance with claim 1 in which said shielding means comprises:

rotationally symmetric metallic shields arranged in spaced side by side relationship, each of said metallic shields surrounding a different one of said thyristors and the drive means and at least a part of the circuit component group connected thereto.

3. A thyristor assembly in accordance with claim 1 in which: said metallic shielding means comprises a shield surrounding all the thyristors of said one thyristor column and the drive means and at least a portion of the circuit component groups connected to said one column.

4. A thyristor assembly in accordance with claim 3 in which: said shield is comprised of two separate shells of substantially semicircular cross section.

5. A thyristor assembly in accordance with claim 4 in which: the longitudinal ends of said shells are curved inward.

6. A thyristor assembly in accordance with claim 4 in which: said one thyristor column is arranged within one of said shells and at least the electronic stages of said drive means and circuit component groups connected to said column are arranged within said other shell.

7. A thyristor assembly in accordance with claim 3 in which: said pressure tube is provided at its opposite ends with mechanical connecting members for detachably connecting said tube to adjoining tubes.

8. A thyristor assembly in accordance with claim 3 in which: each bulkhead means is provided with mechanical connecting members for detachably connecting the pressure tube to an adjoining tube.

9. A thyristor assembly in accordance with claim 1 further including: first and second tubular connecting means disposed between the first and second bulkhead means, respectively, and the respective ends of said tube connected therewith.

10. A thyristor assembly in accordance with claim 9 in which: said first and second tubular connecting means have gas inlet and outlet openings, respectively.

11. A thyristor assembly in accordance with claim 10 in which: said first and second tubular connecting means have coolant inlet and outlet openings, respectively.

12. A thyristor assembly in accordance with claim 9 in which: each said tubular connecting means includes at least one opening adapted to receive a light guide.

13. A thyristor assembly in accordance with claim 9 in which: each said tubular connecting member is provided with an opening adapted to be closed off in a gastight manner and to detachably connect to an electrical connecting element.

14. A thyristor assembly in accordance with claim 1 in which: at least one of said posts is provided with a coolant flow canal which extends through the wall of said pressure tube.

15. A thyristor assembly in accordance with claim 1 in which: at least one of said posts is provided with a light guide canal which extends through said wall of said pressure tube.

16. A thyristor assembly in accordance with claim 15 in which: each said post comprises cast resin.

17. A thyristor assembly in accordance with claim 1 in which: each said electrical connecting element is in the form of a plug connection.

* * * * *